United States Patent
Yu et al.

[11] Patent Number: 5,889,309
[45] Date of Patent: Mar. 30, 1999

[54] ELECTROSTATIC DISCHARGE PROTECTION CIRCUIT

[75] Inventors: Ta-Lee Yu, Hsinchu Hsien; Chau-Neng Wu, Kaohsiung Hsien; Ling-Yen Yeh, Taipei; Frank S-T Lin, Taipei; Konrad Young, Taipei, all of Taiwan

[73] Assignee: Windbond Electronics, Corp., Hsinchu, Taiwan

[21] Appl. No.: 770,650

[22] Filed: Dec. 19, 1996

[30] Foreign Application Priority Data

Nov. 7, 1996 [TW] Taiwan ................................. 85113627

[51] Int. Cl.$^6$ ............................................. H01L 23/62
[52] U.S. Cl. ...................... 257/363; 257/355; 257/362; 257/556
[58] Field of Search ................................ 257/362, 361, 257/355, 356, 357, 358, 360, 363, 555, 556, 575, 173

[56] References Cited

U.S. PATENT DOCUMENTS

| | | | |
|---|---|---|---|
| 4,903,093 | 2/1990 | Ide et al. | 257/363 |
| 5,158,899 | 10/1992 | Yamagata | 437/27 |
| 5,235,201 | 8/1993 | Honna | 257/357 |
| 5,272,097 | 12/1993 | Shiota | 437/34 |
| 5,290,724 | 3/1994 | Leach | 437/51 |
| 5,304,839 | 4/1994 | Chen et al. | 257/546 |
| 5,336,908 | 8/1994 | Roberts | 257/173 |
| 5,430,595 | 7/1995 | Wagner et al. | 361/56 |
| 5,432,368 | 7/1995 | Jimenez | 257/355 |
| 5,438,213 | 8/1995 | Taillet | 257/360 |
| 5,455,436 | 10/1995 | Cheng | 257/356 |
| 5,473,169 | 12/1995 | Ker et al. | 257/173 |
| 5,637,900 | 6/1997 | Ker et al. | 257/355 |

FOREIGN PATENT DOCUMENTS

345432  12/1989  European Pat. Off. ............... 257/362

Primary Examiner—Sara Crane
Attorney, Agent, or Firm—Fish & Richardson P.C.

[57] ABSTRACT

An electrostatic discharge protection circuit formed in a semiconductor substrate includes a vertical bipolar junction transistor having a base which is grounded, an emitter connected to an output/input bonding pad of an integrated circuit, and a collector connected to a high power source via a resistor. The resistor is a parasitic resistor created by controlling the distance between the diffusion regions or the distance between a p-type well region and an n-type well region or formed by a lightly doped diffusion region in the semiconductor substrate to prevent current crowding and increase electrostatic protection.

11 Claims, 7 Drawing Sheets

ELECTROSTATIC DISCHARGE PROTECTION CIRCUIT

BACKGROUND OF THE INVENTION

1. Field of the Invention

The invention relates to an electrostatic discharge protection circuit of an integrated circuit and, in particular, to an electrostatic discharge protection circuit with a diode structure.

2. Description of Related Art

Using two field effect transistors (FET) as an electrostatic discharge protection circuit is common in the design of integrated circuits. The electrostatic discharge function is provided by the parasitic diode(s) inside the field effect transistors, thus the electrostatic protection circuit should have a diode structure.

Figure 1:
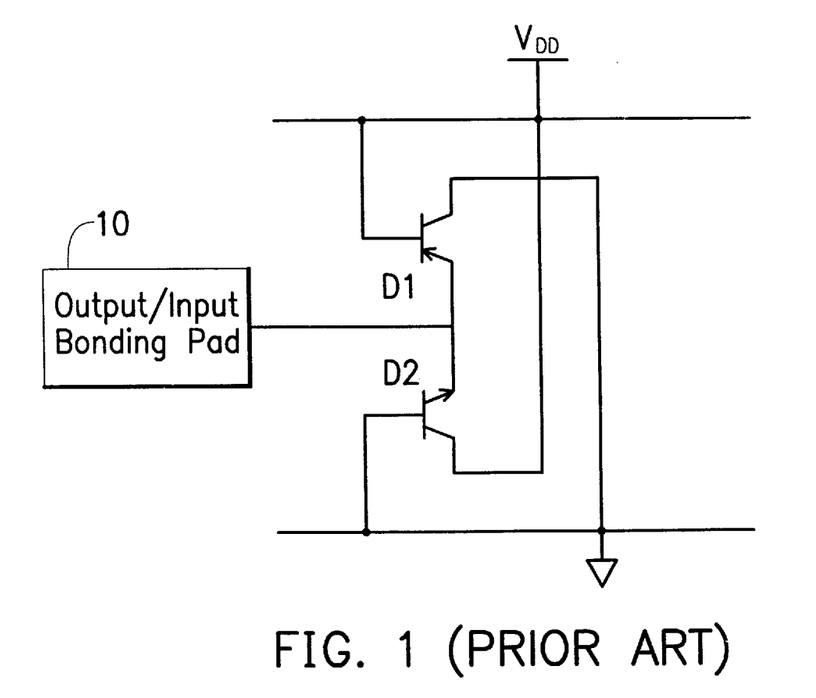
FIG. 1 is a schematic view showing the traditional electrostatic discharge protection circuit.
Figure 2:
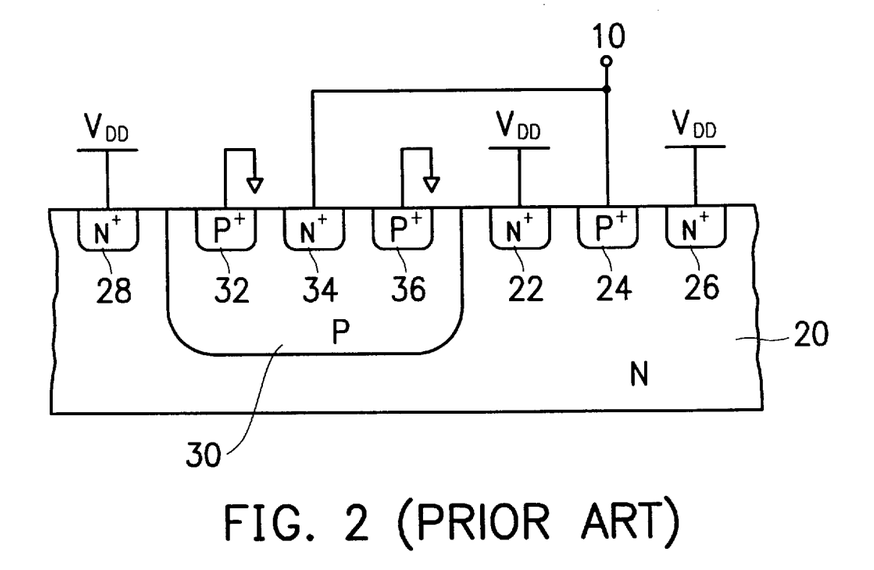
FIG. 2 is a cross-sectional view of the circuit in FIG. 1 formed in a semiconductor substrate.

Referring to FIG. 1, the device structure equivalent circuit of a twin-diode electrostatic discharge protection circuit is formed in a semiconductor substrate and a cross-sectional view of the device structure is shown in FIG. 2. Twin-diodes D1 and D2 are shown in FIG. 1 with diode D1 connected between a power source $V_{DD}$ and an output/input bonding pad 10 while diode D2 is connected between the output/input bonding pad 10 and a ground point. Because the diode structure displays enormous ability in protecting against electrostatic discharge and has a very low input capacitance, it is suitable for use in protecting integrated circuits from electrostatic discharge damage.

When the twin-diode electrostatic discharge structure receives an external electrostatic force, it will act differently, depending on the kind of electrostatic force applied to the structure. By using 4 kinds of human body electrostatic force models applied to the protection circuit and using the cross-sectional view of the device structure shown in FIG. 2, the manner in which the protection circuit operates and its drawbacks can be made more easily understandable.

The first model is an electrostatic force which is positive with respect to a ground. This positive electrostatic force can cause the junction of an n+ diffusion region 34 in a p-type well region 30 to breakdown, and the lateral pnp bipolar junction transistor formed by a p-type well region 30, an n-type substrate 20 and a p+ diffusion region 24 to discharge the electrostatic force.

The second model is an electrostatic force which is negative with respect to a ground. This negative electrostatic force can create a forward bias voltage between an n+ diffusion region 34 and a p+ diffusion region 32 within p-type well region 30, the forward bias voltage discharging the electrostatic force.

The third model is an electrostatic force which is positive with respect to the $V_{DD}$. Since the electrostatic force is higher than the high power source $V_{DD}$, a forward bias voltage is created from a p+ diffusion region 24 to all n+ diffusion regions 22, 26, and 28 in the n-type substrate 20 connected to $V_{DD}$. The electrostatic force is then discharged by the forward current.

The fourth model is an electrostatic force negative with respect to the high voltage $V_{DD}$. This negative electrostatic force can cause the junction of a p+ diffusion region 24 in the substrate 20 to breakdown. Moreover, a current path in a vertical npn bipolar junction transistor will be created by the n+ diffusion region 34 in p-type well region 30, the p-type well region 30 itself, and substrate 20. The current gain of the vertical bipolar junction transistor is around 20–110, so that once the junction of a $p^+$ diffusion region 24 breaks down, a large electrostatic current flows from a well region 30 to substrate 20 forming a high-level injection phenomenon. Furthermore, because of the close spacing between $n^+$ diffusion region 22 and p-type well region 30, current crowding occurs near the junction between the p-type well region 30 and the n-type substrate 20, resulting in the damage of the device structure.

During electrostatic discharge of the fourth electrostatic model type the device structure can be easily damaged, thereby affecting the function of the protection circuit. Because the current path in the vertical transistor with high current gain is not completely used, but rather causes device electrostatic damage, a new design for an electrostatic discharge protection circuit with a traditional diode structure is required for providing complete protection of the integrated circuit.

SUMMARY OF THE INVENTION

The invention is intended to prevent current crowding inside an electrostatic protection circuit with a diode structure and to increase the effectiveness of the electrostatic discharge protection circuit.

The electrostatic discharge protection circuit with a diode structure of the invention can use a bipolar junction transistor path inside the device structure to more efficiently discharge the electrostatic force and enhance the electrostatic discharge protection function.

A traditional electrostatic discharge protection circuit with a diode structure formed in a semiconductor substrate comprises a lateral bipolar junction transistor and a vertical bipolar junction transistor, wherein the base of the lateral bipolar junction transistor is connected to a high power source, the collector is connected to a ground, and the emitter is connected to an output/input bonding pad. The base of the vertical bipolar junction transistor is connected to the ground and the emitter is connected to the output/input bonding pad. The invention provides a resistor connected between the collector of the vertical bipolar junction transistor and the high power source to prevent the current crowding effect, while preserving and even enhancing the high current gain of the vertical bipolar junction transistor, thereby increasing its ability to discharge the electrostatic force.

In one aspect of the invention, the electrostatic discharge protection circuit of the invention uses a pre-existing semiconductor technology formed in a semiconductor substrate, and includes a well region, a first diffusion region, a second diffusion region, and a third diffusion region. The well region is formed by a diffusion region grounded by means of the second diffusion region and the first diffusion region in the well region is connected to the output/input bonding pad. However, the third diffusion region must be kept a predetermined distance from the well region to provide a sufficient parasitic resistance as the resistor, mentioned above, which is connected to the collector of the vertical bipolar junction transistor. The predetermined distance must be at least 6 times the critical feature size of the semiconductor technology. Thus, the electrostatic discharge path of the vertical bipolar junction transistor formed by the first diffusion region, the well region, and the substrate prevents damage resulting from the current crowding, maintains the normal structure of the electrostatic discharge devices and increases the electrostatic discharge efficiency. These advantages are provided because the distance between the first diffusion region and the well region are large enough to provide a sufficient parasitic resistance which divides the voltage generated by current crowding.

To make the objectives, characteristics, and advantages of the invention more easily understandable, an embodiment will be described in connection with the enclosed drawings as follows.

DETAILED DESCRIPTION OF THE PREFERRED EMBODIMENT

Figure 3:
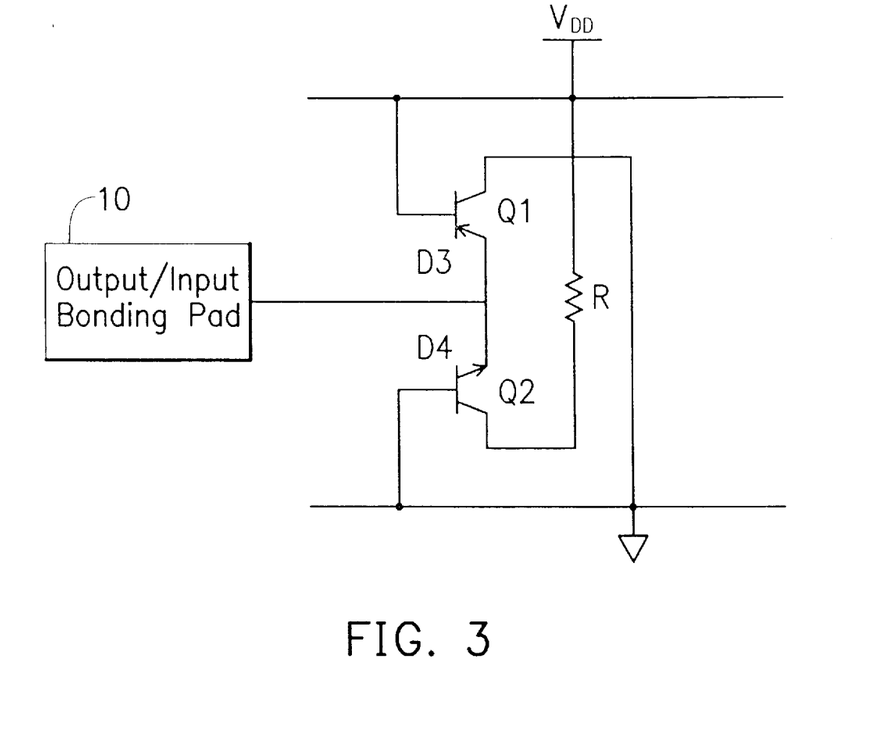
FIG. 3 is a schematic view showing the electrostatic discharge protection circuit according to one embodiment of the invention.
Figure 4:
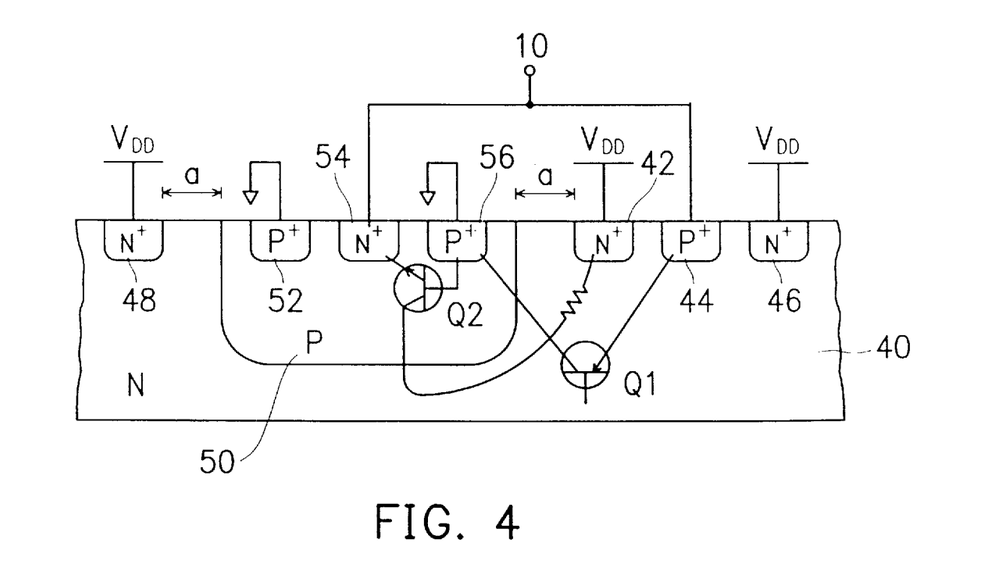
FIG. 4 is a cross-sectional side view of the circuit of FIG. 3 formed in semiconductor substrate.

Referring to FIG. 3, the electrostatic discharge protection circuit of the embodiment includes two diodes D3 and D4 in the form of two bipolar junction transistors Q1 and Q2 respectively. The structure of the circuit is provided in a semiconductor substrate as shown in FIG. 4, transistor Q1 being formed as a lateral bipolar junction transistor while transistor Q2 is formed as a vertical bipolar junction transistor. Hence, the electrostatic discharge protection circuit includes in addition to the transistors Q1 and Q2 mentioned above, a resistor R.

The base of the lateral bipolar junction transistor Q1 is connected to a first power source ($V_{DD}$), its collector is connected to a second power source, and its emitter is connected to a signal input end. The base of the vertical bipolar junction transistor Q2 is connected to the second power source and its emitter is connected to the same signal input end mentioned above. Resistor R is connected between the collector of the transistor Q2 and the first power source. In this embodiment, the lateral bipolar junction transistor Q1 is a pnp transistor and the vertical bipolar junction transistor Q2 is an npn transistor, the first power source is high power source $V_{DD}$ and the second power source is connected to a ground. Moreover, the signal input end is connected to the output/input bonding pad 10.

Connecting resistor R to the collector of the lateral bipolar junction transistor provides a collector current dependent upon the dividing voltage and resistor R to prevent the current crowding problem. Resistor R need not be provided with extra manufacturing. Rather, the parasitic resistance of the integrated circuit can be used directly as the resistor R shown in FIG. 4. As shown in FIG. 4, the electrostatic discharge protection circuit is formed in a semiconductor substrate 40 in which a well region 50 is formed by a diffusion region. The well region 50 includes at least one first diffusion region 54 and one second diffusion region 56. The first diffusion region 54 provides a signal input end connected to the output/input bonding pad 10 of the integrated circuit to attract the electrostatic force. The second diffusion region 56 is connected to a second power source for providing well region 50 an appropriate bias voltage. In addition, at least one third diffusion region 42 is formed in the substrate 40 and is connected to the first power source to provide substrate 40 with a bias voltage. With the structure formed in substrate 40 as mentioned above, the vertical bipolar junction transistor Q2 is formed by the first diffusion region 54, the well region 50 and the substrate 40. In this embodiment, the substrate is n-type the well region 50 is a p-type well region and the first diffusion region is an $n^+$ diffusion region. Thus, the vertical bipolar junction transistor Q2 is an npn transistor. The collector of the npn transistor is represented by substrate 40 and is connected to the first power source with third diffusion region 42 via a parasitic resistance existing inside the substrate between the well region 50 and the third diffusion region 42. Therefore, the distance "a" between the third diffusion region 42 and the well region 50 is an important control factor.

Figure 5:
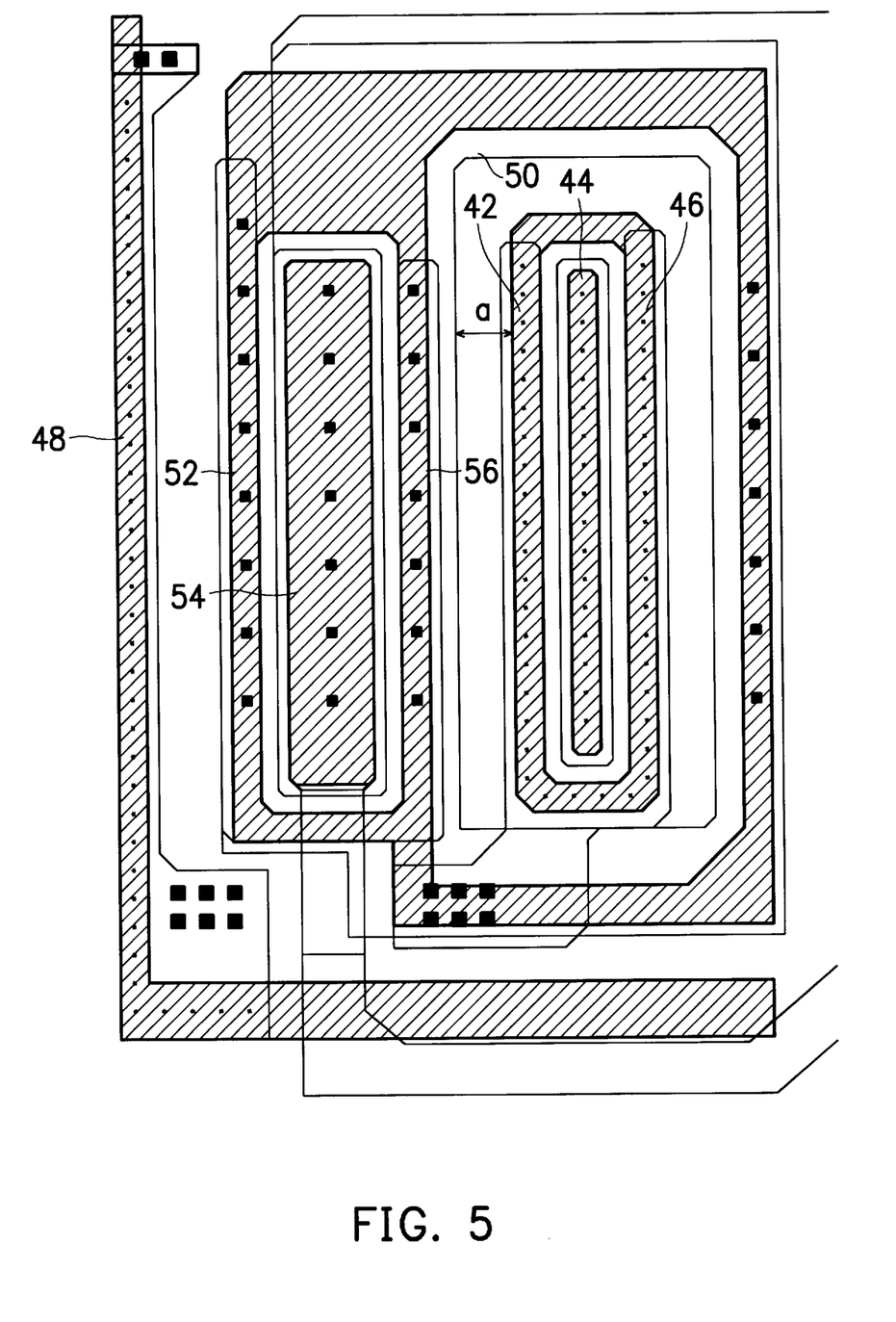
FIG. 5 a top view of the circuit structure of FIG. 4.

Distance "a" between the third diffusion region 42 and the well region 50 must be at least 6 times the critical feature size of the semiconductor manufacturing technology. For instance, when the integrated circuit is manufactured by a 0.5 micron process, the distances among other diffusion regions may be kept around 0.5 micron to shrink the layout area as much as possible and increase the capacity of the circuit. However, the distance between the third diffusion region 42 and the well region 50 cannot be less than 3 microns in order to maintain enough parasitic resistance to prevent current crowding. Taking the electrostatic protection ability, at least a 2× safety factor and the layout area of the integrated circuit into account, the suggested preferred range of the distance "a" is 6~20 times the critical feature size in the invention. For example, in a 0.5 micron process, the appropriate distance "a" is preferably from 3 to 10 microns as shown in FIG. 5 with the relatively large distance "a" providing the parasitic resistance.

Figure 6:
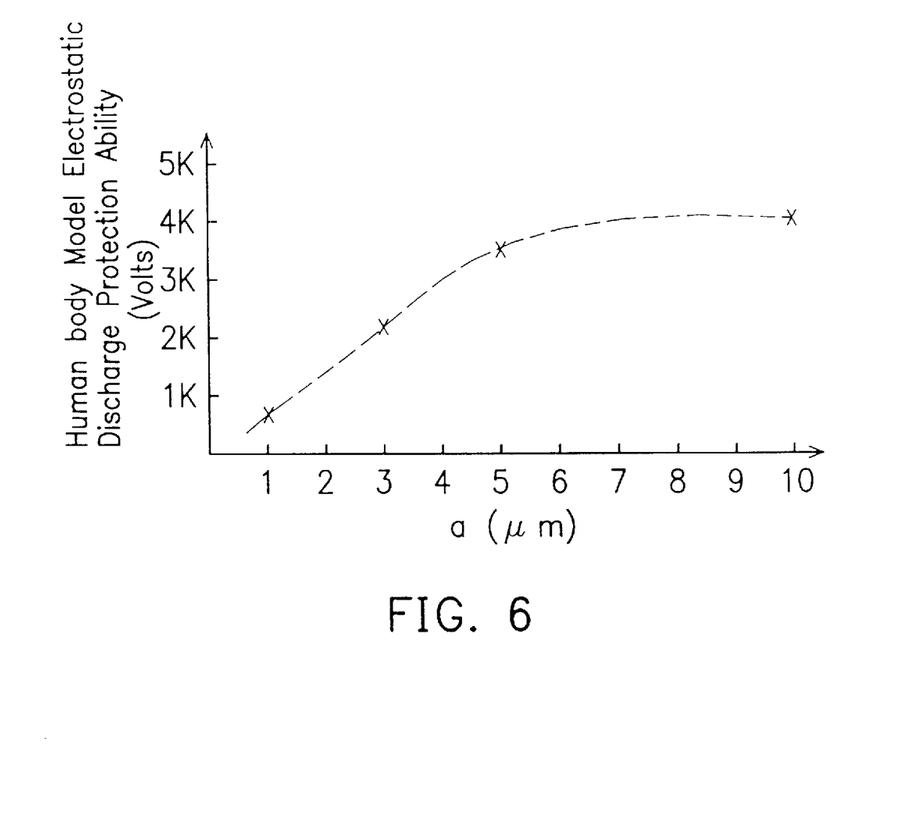
FIG. 6 is a graph showing the relationship between the distance "a" between the diffusion region and the well region and the electrostatic protection ability of the circuit.

To further demonstrate the relationship between distance "a" and the degree of electrostatic protection, the ESD protection ability in units of volts was measured for different values of distance "a". The test results for the protection circuit manufactured by a 0.5 micron process with different "a" values, such as 1,3,5, 10 microns, etc., are shown in FIG. 6. As shown in the graph of FIG. 6, the protection circuit with a distance "a" of 1 micron can only provide 0.5 KV of human body model protection. However, when the distance "a" is more than 3 microns, the protection ability is increased to more than 2 KV, the larger distance "a" enhancing the ability to provide electrostatic discharge protection.

In accordance with the description above, other diffusion regions may be formed within the device structure of FIG. 4. For example, a fourth diffusion region 44 connected to the output/input bonding pad 10 as a signal input end does not require the increased distance from other diffusion regions. However, any diffusion region which provides a bias voltage to the substrate 40, such as diffusion regions 46 and 48, must maintain a spacing distance from the well region 50 that is at least 6 times the critical feature size.

Figure 7:
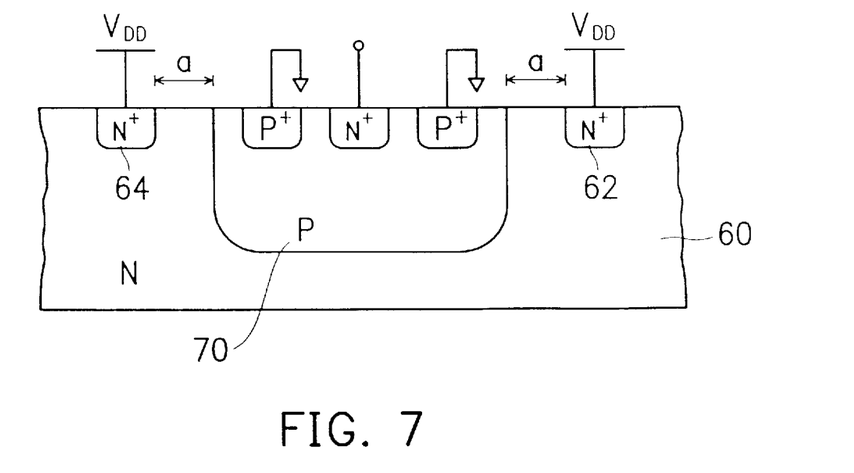
FIG. 7 is a cross-sectional side view showing the circuit structure according to another embodiment of the invention.

Furthermore, the electrostatic discharge protection circuit can include one diode in the invention. However, the device structure still requires proper spacing between diffusion regions and well regions as discussed above. As shown in FIG. 7, the distance "a" between the p-type well region 70 within the substrate 60 and diffusion regions 62 and 64 must be maintained to be greater than 6 times the critical feature size in order to provide enough parasitic resistance to prevent the current crowding problem of the vertical bipolar junction transistor.

Figure 8:
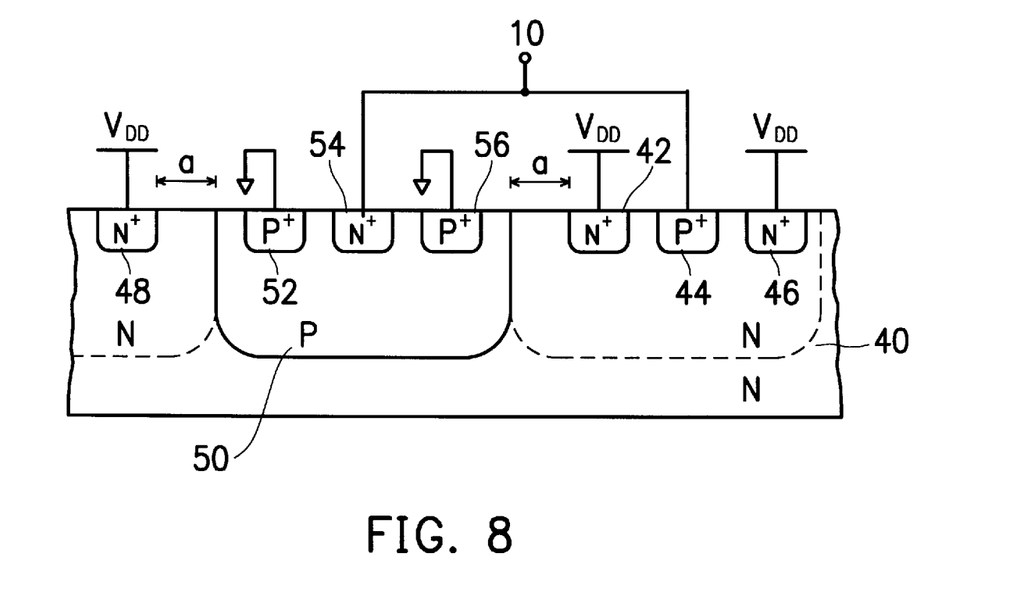
FIG. 8 is a cross-sectional side view showing the circuit structure according to still another embodiment of the invention.

Referring to FIG. 8, the diffusion regions of a twin-well region protection circuit for providing a bias voltage to n-type well regions must also be spaced from the p-type well region by a distance of over 6 times the critical feature size to prevent damage caused by current crowding.

Figure 9:
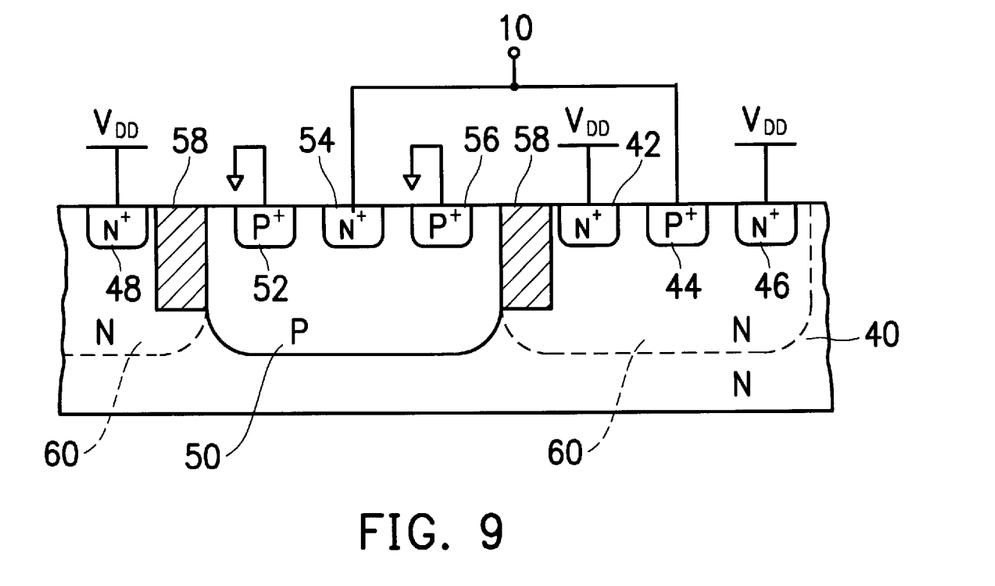
FIG. 9 is a cross-sectional side view showing the circuit structure according to still another embodiment of the invention.
Figure 10:
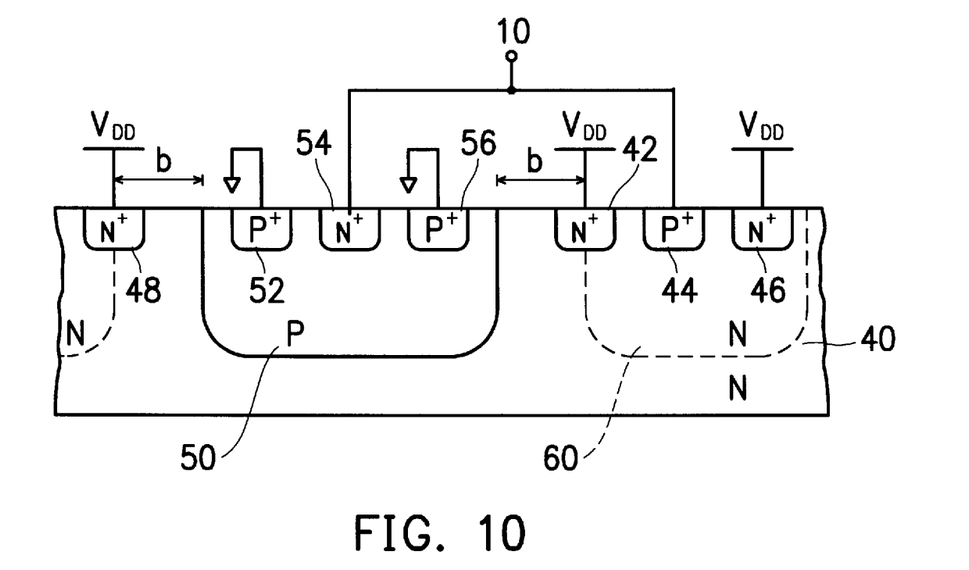
FIG. 10 is a cross-sectional side view showing the circuit structure according to still another embodiment of the invention.

Furthermore, for the above-referred twin-well region protection circuit, there are two other ways to produce the parasitic resistor between the P-type well region 50 and $N^+$-type diffusion region 42, located in N-type well region 60 as shown in FIG. 9 and FIG. 10 respectively, in addition to the way increasing spacing to produce the parasitic resistor mentioned above. The first way is explained in FIG. 9 wherein the parasitic resistor can be formed by a lightly doped regions 58 formed by implanting a P-type impurity into part of the N-type well region 60 between the P-type well region 50 and $N^+$-type diffusion region 42. The second way shown in FIG. 10, the P-type well region 50 and N-type well region 60 are spaced a distance "b" from each other in the N-type substrate 40, thereby the parasitic resistor produced and dependent upon the distance "b" between the P-type well region 50 and N-type well region 60 wherein the N-type substrate 40 and N-type well region 60 are provided with about $5\times10^{14} \sim 5\times10^{15}$ cm$^{-3}$ and $1\times10^{16} \sim 5\times10^{17}$ cm$^{-3}$ in concentration, respectively.

What is claimed is:

1. An electrostatic discharge protection circuit which during operation is connected to first and second power nodes, said protection circuit formed in a semiconductor substrate, comprising:

a single p-type well inside said semiconductor substrate;

a first diffusion region of n-type located in said p-type well to provide a signal input end;

a second diffusion region of p-type located in said p-type well and connected to the first power node;

an n-type well contacting said p-type well in said semiconductor substrate;

a third diffusion region of n-type connected to the second power node and located in said n-type well; and a fourth diffusion region being more lightly doped than said n-type well and located within said n-type well and located between said p-type well and said third diffusion region.

2. The electrostatic discharge protection circuit as claimed in claim 1 wherein said fourth diffusion region is an n$^-$-type diffusion region.

3. The electrostatic discharge protection circuit as claimed in claim 1, further comprising an output/input bonding pad of an integrated circuit and wherein said signal input end is connected to said output/input bonding pad of an integrated circuit.

4. An electrostatic discharge protection circuit which during operation is connected to first and second power nodes, said protection circuit formed in a semiconductor substrate of a first conductivity type, said protection circuit comprising:

a single well of a second conductivity type formed inside said semiconductor substrate;

a first diffusion region of the first conductivity type located in said well that provides a signal input end;

a second diffusion region of the second conductivity type located in said well and connected to the first power node; and a third diffusion region of the first conductivity type connected to the second power node and located in said semiconductor substrate, said third diffusion region spaced from said well by a distance of about 3 to 10 microns.

5. An electrostatic discharge protection circuit which during operation is connected to first and second power nodes, said protection circuit formed in a semiconductor substrate of n-type, comprising:

a single p-type well inside said semiconductor substrate;

a first diffusion region of p-type located in said p-type well to provide a signal input end;

a second diffusion region of n-type located in said p-type well and connected to the first power node;

an n-type well near said p-type well in said semiconductor substrate; and a third diffusion region connected to the second power node, located in said n-type well and maintained at a distance of about 3–10 microns from said p-type well.

6. The electrostatic discharge protection circuit of claim 4, further comprising an integrated circuit pad located on said substrate and wherein said signal input end is connected to the integrated circuit pad.

7. The electrostatic discharge protection circuit of claim 6, further comprising a fourth diffusion region of the second conductivity type located in said semiconductor substrate and connected to the integrated circuit pad.

8. The electrostatic discharge protection circuit of claim 5, further comprising an integrated circuit pad located on said substrate and wherein said signal input end is connected to the integrated circuit pad.

9. The electrostatic discharge protection circuit of claim 8, further comprising a fourth diffusion region located in said semiconductor substrate and connected to the integrated circuit pad.

10. The electrostatic discharge protection circuit of claim 4, wherein the first and second conductivity types are p-type and n-type, respectively.

11. The electrostatic discharge protection circuit of claim 4, wherein the first and second conductivity types are n-type and p-type, respectively.

* * * * *